US007120882B2

(12) United States Patent
Kotani et al.

(10) Patent No.: US 7,120,882 B2
(45) Date of Patent: Oct. 10, 2006

(54) METHOD OF SETTING PROCESS PARAMETER AND METHOD OF SETTING PROCESS PARAMETER AND/OR DESIGN RULE

(75) Inventors: Toshiya Kotani, Sagamihara (JP); Satoshi Tanaka, Kawasaki (JP); Koji Hashimoto, Yokohama (JP); Soichi Inoue, Yokohama (JP); Ichiro Mori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/105,431

(22) Filed: Apr. 14, 2005

(65) Prior Publication Data

US 2005/0177811 A1 Aug. 11, 2005

Related U.S. Application Data

(62) Division of application No. 10/385,628, filed on Mar. 12, 2003.

(30) Foreign Application Priority Data

| Mar. 12, 2002 | (JP) | ............................. 2002-066911 |
| Apr. 11, 2002 | (JP) | ............................. 2002-109311 |

(51) Int. Cl.
*G06F 17/50* (2006.01)
(52) U.S. Cl. ................................. 716/5; 716/2; 716/19
(58) Field of Classification Search .................... 716/2, 716/5, 19, 21
See application file for complete search history.

(56) References Cited

U.S. PATENT DOCUMENTS

| 5,225,998 | A | 7/1993 | Singhal |
| 6,161,054 | A | 12/2000 | Rosenthal et al. |
| 6,368,884 | B1 | 4/2002 | Goodwin et al. |
| 6,378,123 | B1* | 4/2002 | Dupenloup .................. 716/18 |
| 6,470,230 | B1 | 10/2002 | Toprac et al. |
| 6,577,994 | B1* | 6/2003 | Tsukuda |
| 6,587,744 | B1 | 7/2003 | Stoddard et al. |
| 6,622,059 | B1 | 9/2003 | Toprac et al. |
| 6,633,831 | B1 | 10/2003 | Nikoonahad et al. |
| 6,684,382 | B1* | 1/2004 | Liu ............................. 716/19 |
| 6,721,940 | B1* | 4/2004 | Miwa et al. .................. 716/21 |

(Continued)

FOREIGN PATENT DOCUMENTS

JP 7-175204 7/1995

(Continued)

OTHER PUBLICATIONS

Notification of Reasons for Rejection issued by Japanese Patent Office mailed Apr. 18, 2006, in Japanese Application No. 2003-064592 and English translation of Notice.*

*Primary Examiner*—Stacy A. Whitmore
(74) *Attorney, Agent, or Firm*—Finnegan, Henderson, Farabow, Garrett & Dunner, L.L.P.

(57) ABSTRACT

Disclosed is a method of setting a process parameter for use in manufacturing a semiconductor integrated circuit, comprising correcting a first pattern by using process parameter information to obtain a second pattern, the first pattern being one which corresponds to a design layout of the semiconductor integrated circuit, predicting a third pattern by using the process parameter information, the third pattern being one which corresponds to the second pattern and which is to be formed on a semiconductor wafer in an etching process, obtaining an evaluation value by comparing the third pattern with the first pattern, determining whether the evaluation value satisfies a preset condition, and changing the process parameter information when the evaluation value is found not to satisfy the preset condition.

11 Claims, 9 Drawing Sheets

U.S. PATENT DOCUMENTS

| | | |
|---|---|---|
| 7,005,218 B1 * | 2/2006 | Zhang .......................... 430/5 |
| 2002/0002697 A1 | 1/2002 | Kotani et al. |
| 2002/0188417 A1 | 12/2002 | Levy et al. |
| 2003/0046653 A1 * | 3/2003 | Liu ............................. 716/19 |
| 2004/0044431 A1 | 3/2004 | Pellegrini et al. |

FOREIGN PATENT DOCUMENTS

| | | | |
|---|---|---|---|
| JP | 2000-277426 | | 10/2000 |
| JP | 2001-14376 | * | 1/2001 |
| JP | 2002-26126 | | 1/2002 |

* cited by examiner

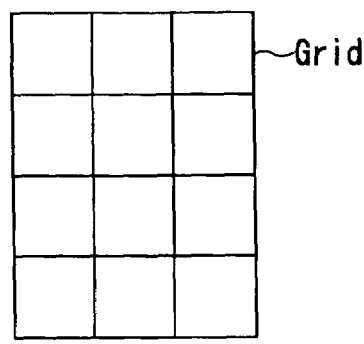
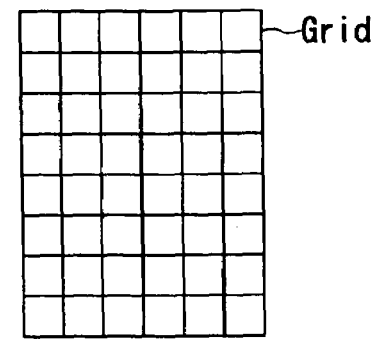
FIG. 5A  FIG. 5B
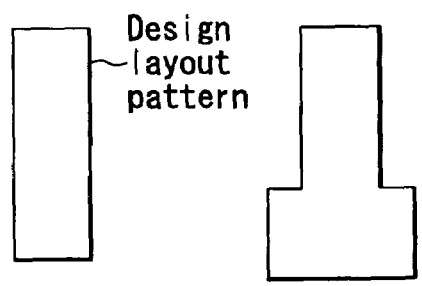
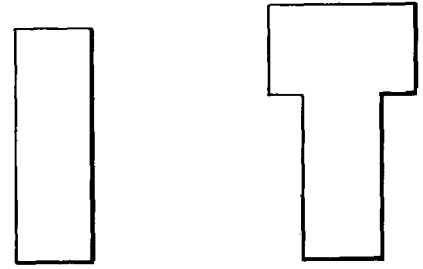
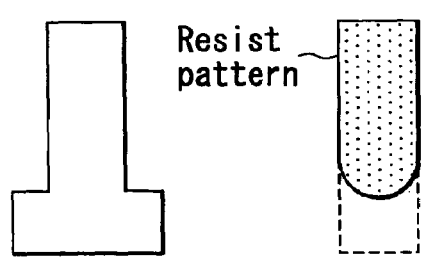
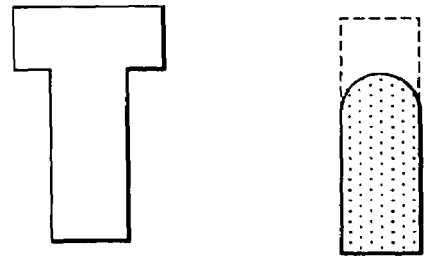
FIG. 6A  FIG. 6B  FIG. 6C  FIG. 6D

METHOD OF SETTING PROCESS PARAMETER AND METHOD OF SETTING PROCESS PARAMETER AND/OR DESIGN RULE

CROSS-REFERENCE TO RELATED APPLICATIONS

This application is a division of application Ser. No. 10/385,628, filed Mar. 12, 2003, which is incorporated in its entirety herein by reference. This application is also based upon and claims priority from prior Japanese Patent Applications No. 2002-66911, filed Mar. 12, 2002; and No. 2002-109311, filed Apr. 11, 2002, the entire contents of both of which are incorporated herein by reference.

BACKGROUND OF THE INVENTION

1. Field of the Invention

The present invention relates to a method of setting process parameter for use in manufacturing a semiconductor integrated circuit. The invention also relates to a method of setting process parameter or design rule, or both the parameter and the rule.

2. Description of the Related Art

Recent years saw a rapid advancement of the technology of manufacturing semiconductor integrated circuits. The technology now manufactures semiconductor integrated circuits with the minimum process size of 0.18 μm. The manufacture of such circuits owes to the remarkable progress of micro-pattern forming techniques including mask process, lithography process and etching process.

In the era when the pattern size was sufficiently large, it was possible to form, on a semiconductor wafer, a pattern that is almost identical to the design pattern. The pattern therefore satisfied the specifications as is demanded. As patterns grow finer and more complex, however, it becomes difficult to form, on semiconductor wafers, patterns that accord with the design patterns. In other words, the patterns formed can hardly satisfy the specifications.

Jpn. Pat. Appln. KOKAI Publication No. 7-175204 proposes a method of optimizing the conditions for the process by optimizing the parameters of the mask process or the lithography process. Jpn. Pat. Appln. KOKAI Publication No. 2000-277426 proposes a method of setting optimal exposure conditions for the basic patterns (i.e., line-and-space (L/S) pattern and isolated pattern) of a device. In this method, the exposure conditions are set in consideration of the mask bias based on optical proximity correction (OPC).

In the methods disclosed in Publication No. 2000-277426, the optical exposure conditions are set in consideration of the mask process and the lithography process only. The changes in size, which take place in the etching process, are not taken into account in the method. In view of this, the method cannot be said to provide desired device patterns. Hence, the conventional techniques described above can hardly serve to manufacture devices of such micro-patterns as is desired.

As indicated above, the changes in size, occurring in the etching process, are not considered in the conventional methods. Consequently, it is difficult for the conventional methods to set appropriate process parameters and to form desirable patterns on semiconductor wafers.

Jpn. Pat. Appln. KOKAI Publication No. 2000-199839 proposes a method that can shorten TAT (Turn Around Time) and reduce chip size. This method performs a sequence of steps. First, the design layout of the previous generation is compacted in accordance with the design rules (D.R.) for providing the design layout of the next generation. Then, mask-data processing (MDP) and lithography simulation are performed, by using the design layout thus compacted. Further, the results of both the mask-data processing and the lithography simulation are fed back to the design rules. This method can determine the design rule from the layout pattern that is similar to the actual device layout. Thus determined, the design rule is free of problems that may actually arise in the manufacture of semiconductor integrated circuits.

A design layout prepared by using the design rule obtained by the method described above cannot always provide chips of desired sizes. If the design rule is mitigated for a pattern that has been found dissatisfactory, design rules are mitigated for any other patterns, too. Then, the chip size will be larger than is desired.

To form the patterns in desired sizes, more types of design rules may be formulated. It is practically impossible, however, to allocate a particular design rule to each pattern. The more design rules, the longer the time required to prepare a design layout, and the more complex the verification achieved by using a design rule checker (D.R.C.).

Unless appropriate design rules are allocated to all patterns to be formed, there may be formed dangerous patterns that fail to satisfy prescribed process latitude. The design rules are closely related to the chip sizes (chip areas). If the design rule is mitigated, the chip area will inevitably increase. It is therefore important to set appropriate design rules in accordance with the relation between the number and types of dangerous patterns, the chip size and design rule.

The number of dangerous patterns and the chip area change, depending on not only the design rule but also process parameters. Even if a specific design rule is applied, the number of dangerous patterns and the chip area will change in accordance with the wavelength of exposure light ($\lambda$), the numerical aperture (NA) of the lens, the illumination shape ($\sigma$, $\epsilon$), the phase and transmittance of the photomask, the overlay error, and the like.

It is therefore important to grasp the relation between the chip size, dangerous pattern, design rule and process parameters and apply the relation in preparation of the masks. Hitherto, however, such a relation has not been fully applied to the preparation of masks. Inevitably it has been difficult to set such optimal design rules or process parameters as would reduce the chip size as much as possible.

As pointed out above, the changes in size, which occur in the etching process, have not considered. It is therefore difficult to set appropriate process parameters in the conventional methods. Furthermore, it has been hard to set such design rules or such process parameters as would reduce the chip size to a minimum. To this date it has been difficult to form desired patterns on semiconductor wafers.

BRIEF SUMMARY OF THE INVENTION

According to a first aspect of this invention, there is provided a method of setting a process parameter for use in manufacturing a semiconductor integrated circuit, comprising: correcting a first pattern by using process parameter information to obtain a second pattern, the first pattern being one which corresponds to a design layout of the semiconductor integrated circuit; predicting a third pattern by using the process parameter information, the third pattern being one which corresponds to the second pattern and which is to be formed on a semiconductor wafer in an etching process;

obtaining an evaluation value by comparing the third pattern with the first pattern; determining whether the evaluation value satisfies a preset condition; and changing the process parameter information when the evaluation value is found not to satisfy the preset condition.

According to a second aspect of this invention, there is provided a method of setting at least one of a process parameter and a design rule for use in manufacturing a semiconductor integrated circuit, comprising: compacting a first pattern by using design rule information to obtain a second pattern, the first pattern being one which corresponds to a design layout of the semiconductor integrated circuit; obtaining chip size information of the semiconductor integrated circuit, which relates to the second pattern; obtaining a third pattern by using process parameter information, the third pattern being one which corresponds to the second pattern and which is to be formed on a semiconductor wafer; comparing the third pattern with the second pattern to obtain a comparison result; extracting a dangerous spot from the second pattern by using the comparison result to obtain dangerous spot information, the dangerous spot not having prescribed latitude; determining whether the chip size information and the dangerous spot information satisfy evaluation conditions, respectively; and changing at least one of the design rule information and the process parameter information when at least one of the chip size information and the dangerous spot information is determined not to satisfy the evaluation conditions.

BRIEF DESCRIPTION OF THE SEVERAL VIEWS OF THE DRAWING

FIGS. 5A and 5B are diagrams illustrating minimum grids that are used in mask correction;

FIGS. 6A to 6D are diagrams showing minimum pattern sizes that can be applied to masks;

DETAILED DESCRIPTION OF THE INVENTION

Embodiments of the present invention will be described, with reference to the accompanying drawings.

First Embodiment

Figure 1:
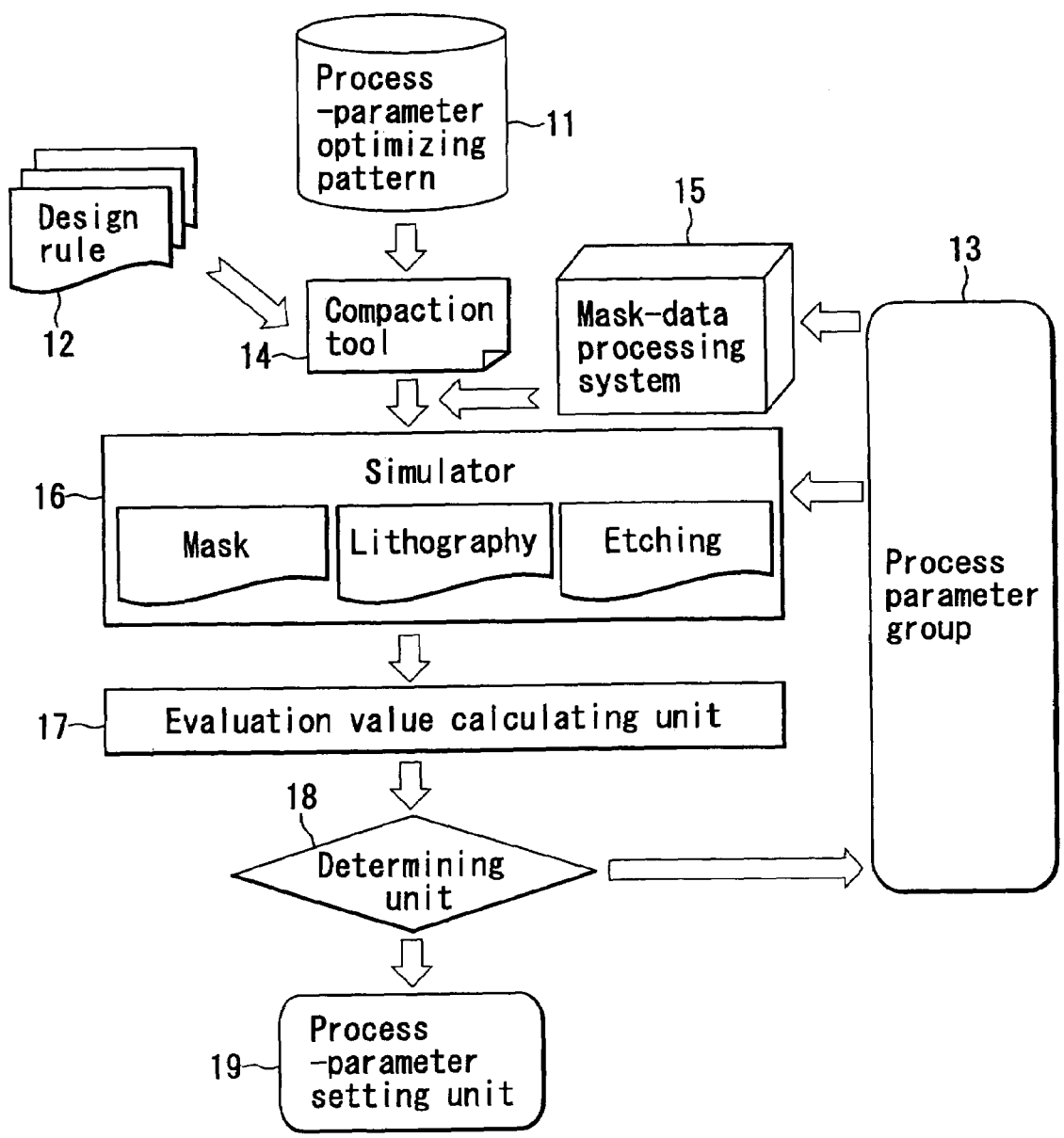
FIG. 1 is a block diagram of a system according to a first embodiment of the present invention.

FIG. 1 is a function-block diagram of a process-parameter setting system according to the first embodiment of the present invention.

Process-pattern optimizing patterns 11, design rules 12 and parameter groups 13 are prepared for the process-parameter setting system. The parameter group 13 includes a plurality of process parameters.

The process-pattern optimizing patterns 11 include design layout patterns for use in various masks or reticles and are similar to patterns of actual devices. The design rules 12 are ones for use in manufacturing, for example, the next-generation devices.

Among the process parameters of the group 13 are parameters that influence the finished shapes of the patterns to be formed on a semiconductor substrate (semiconductor wafer). More precisely, some of the process parameters relate to the mask-forming process, some of the process parameters relate to the lithography process, and some of the process parameters relate to the etching process.

The mask-forming process includes a process of forming a substrate (e.g., mask substrate such as a reticle) that has a pattern to be projected onto the semiconductor substrate. The parameter group 13 includes process parameters that may influence the shape of the patterns to be formed on the semiconductor substrate, depending upon the mask-forming process.

The lithography process includes a process of projecting the mask pattern onto the resist provided on the semiconductor substrate to form a latent image, a process of developing the resist with the latent image, and similar processes. The parameter group 13 includes process parameters that may influence the shape of the patterns to be formed on the semiconductor substrate, depending upon the lithography process.

The etching process includes a process of etching the insulating films or conductive films provided on the semiconductor substrate, by using the resist pattern formed in the lithography process. The parameter group 13 includes process parameters that may influence the shape of the patterns to be formed on the semiconductor substrate, depending upon the etching process.

In other words, the parameter group 13 includes process parameters relating to the exposure apparatus employed, process parameters relating to the mask used, process parameters relating to the resist utilized, process parameters relating to the etching conditions, process parameters relating to the pattern to be formed, and similar parameters.

Examples of the process parameters are: the wavelength ($\lambda$) of exposure light, the numerical aperture (NA) of the lens, the illumination shape ($\sigma$, $\epsilon$), the aberration of the lens, the transmittance of the lens, the type of the mask, the characteristics of the mask-writing machine, the development and etching process of the mask, the phase and transmittance of the mask (e.g., the shifter portion of a phase-shift mask), the focus, the dose, the properties of the resist, the conditions for developing the resist, the etching time, the etching temperature, the etching pressure, the overlay error, the minimal size possible on the mask, and various process proximity correction (PPC) parameters such as the minimum jog/serif width, the minimum grid for correction, the model parameters and or the rule for correction, the number of iterative calculation for correction, the referred distance at correction, the position of evaluated point on the target edge and so on.

Examples of design rules are: the minimum and/or maximum value of the pattern width, the pattern space to the neighboring pattern, the pattern width and/or space to patterns on other layers, the density of patterns (the occupying ratio of the pattern) and so on.

The minimum grid for mask correction will be described. When such a coarse grid as shown in FIG. 5A is used, the mask correction requires a small amount of data, but the correction accuracy is low. When such a fine grid as depicted in FIG. 5B is utilized, the correction accuracy is high, but the mask correction requires a large amount of data. The data amount required and the correction accuracy must be traded off. Hence, a minimum grid is used as a process parameter.

The minimal size possible on the mask will be explained. FIG. 6A illustrates a design layout pattern. If this design layout pattern is corrected, the distance between adjacent pattern elements may be too short as shown in FIG. 6B. The adjacent pattern elements need to be more spaced apart as depicted in FIG. 6C. If they are so spaced, however, it is impossible to form a resist pattern identical to the design layout pattern (FIG. 6A), as is seen from FIG. 6D. This is why the minimal size possible on the mask is utilized.

The compaction tool 14, shown in FIG. 1, compacts the process-pattern optimizing patterns 11, making the patterns to accord with the design rules, and generates compacted patterns. That is, the compaction tool 14 changes or shrinks the design layout patterns 11. If the design rules 12 are those applied to, for example, next-generation devices, the design layout patterns, which satisfy the design rules used in the next-generation devices, will be obtained.

The mask-data processing-system 15 uses the process parameters included in the parameter group 13, thereby to perform a prescribed mask-data processing (MDP). The mask-data processing corrects the design layout patterns compacted by the compaction tool 14. Namely, the mask-data processing unit 15 provides corrected patterns.

The pattern correction includes proximity correction relating to the mask-forming process, proximity correction relating to the lithography process, and proximity correction relating to the etching process. In the mask-forming process, lithography process and etching process, any pattern may deviate from the desired pattern size in accordance with a density of the patterns. Such a phenomenon is a proximity effect. The proximity correction relating to the mask-forming process is performed on the mask pattern to reduce the proximity effect in the mask-forming process. The proximity correction relating to the lithography process is performed on the mask pattern to reduce the proximity effect in the lithography process. The proximity correction relating to the etching process is performed on the mask pattern to reduce the proximity effect in the etching process. A typical example of the proximity correction relating to the lithography process is optical proximity correction (OPC).

The pattern correction described above includes the Boolean operation performed on the design patterns (i.e., AND operation and OR operation on the patterns).

The simulator 16 is designed to predict the device pattern to be formed on the semiconductor substrate by using various parameters included in the parameter group 13. The simulator 16 performs mask-process simulation, lithography-process simulation, and etching-process simulation.

In the mask-process simulation, the shape of the mask pattern to be formed on the mask substrate in the mask-forming process is predicted based on the corrected pattern as described above by using the process parameters included in the parameter group 13. In the lithography-process simulation, the shape of the resist pattern to be formed on the semiconductor substrate in the lithography process is predicted based on the mask pattern thus predicted by using the process parameters included in the group 13. In the etching-process simulation, the shape (finished shape) of the device pattern to be formed on the semiconductor substrate in the etching process based on the resist pattern thus predicted by using the process parameters included in the group 13. Note that the process simulation includes simulation for predicting an overlay error of layers.

The evaluation value calculating unit 17 compares the device pattern predicted in the simulation with the compacted design layout pattern to obtain evaluation value. More specifically, the unit 17 compares the device pattern obtained by the simulation with the compacted design layout pattern in terms of, for example, the size relation between layers, the receding of pattern tip, the width of pattern and the like, obtaining the size deviation and the average value between the patterns compared. The size deviation and the average are used as evaluation value. The size deviation may be obtained from a finished shape predicted on the basis of the best focus condition and best exposure condition of the exposure apparatus. Alternatively, it may be obtained from a finished shape predicted on the basis a defocus condition or an exposure condition other than the best one.

The determining unit 18 determines whether the evaluation value satisfies a predetermined condition. For example, the unit 18 determines whether the evaluation value is smaller than a preset value.

If the evaluation value does not satisfy the predetermined condition, at least one process parameter included in the parameter group 13 is changed to make the evaluation value satisfy the predetermined condition. More precisely, a process parameter such as dose or focus is changed so that the cost function, i.e., latitude of the parameter, may increase to a maximum.

If the evaluation value satisfies the predetermined condition, the process-parameter setting unit 19 determines that the process parameters now set in the group 13 are final process parameters.

Figure 2:
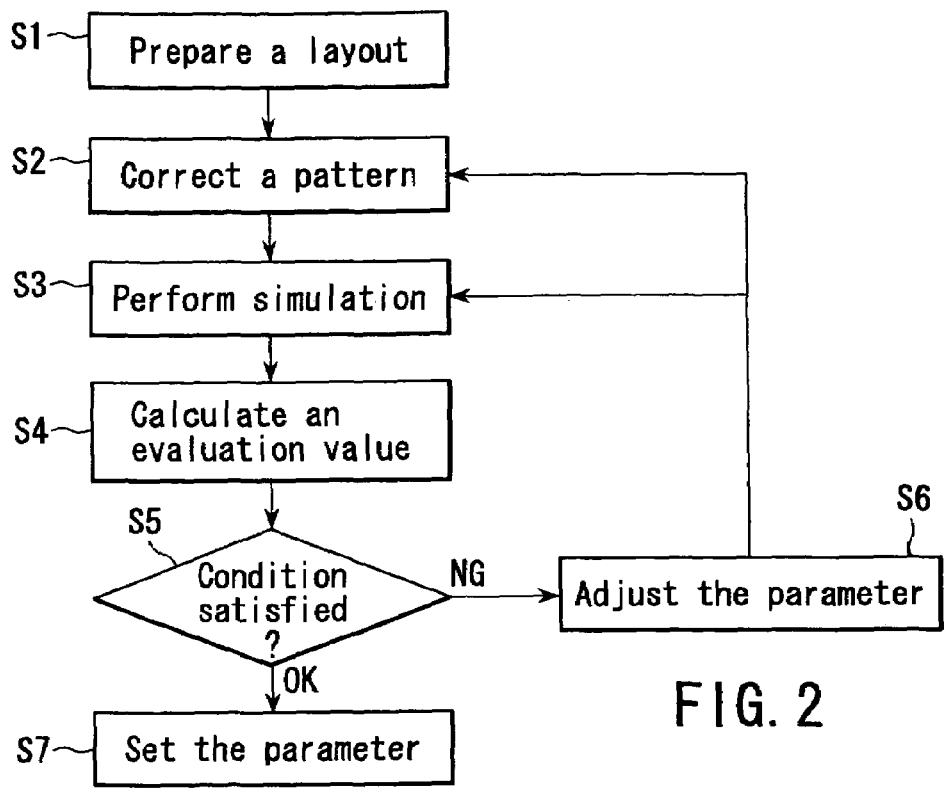
FIG. 2 is a flowchart explaining a method related to the first embodiment of the invention.

How the process-parameter determining system of FIG. 1 operates will be described, with reference to the flowchart of FIG. 2 and the pattern diagrams of FIGS. 3A to 3D.

Figure 3A:
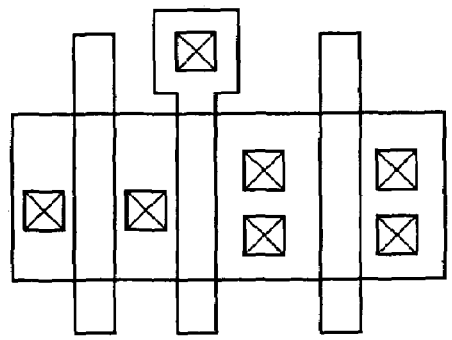
FIGS. 3A to 3D are diagrams explaining the method related to the first embodiment of the invention.

First, in Step S1 the compaction tool 14 generates such a design layout pattern as shown in FIG. 3A.

Figure 3B:
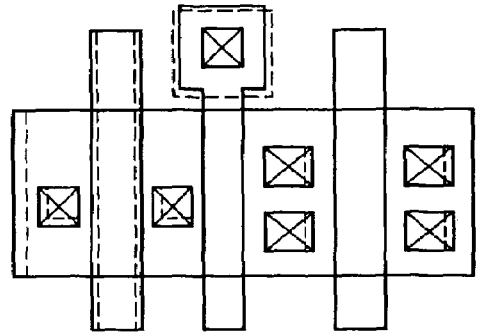

In Step S2, the mask-data processing system 15 performs mask data processing by using the process parameters included in the parameter group 13. In the mask-data processing, proximity correction is carried out on the compacted design layout pattern, and such a corrected mask pattern as illustrated in FIG. 3B is obtained. In FIG. 3B, the solid lines indicate the corrected mask pattern, while the broken lines indicate the design layout pattern.

Figure 3C:
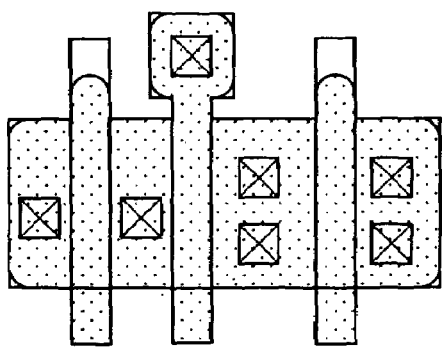

In Step S3, the simulator 16 performs various simulations by using the process parameters included in the parameter group 13. The simulator 16 predicts the finished shape of the device pattern to be formed on the semiconductor substrate, which is shown in FIG. 3C. In FIG. 3C, the dotted part is the device pattern simulated.

Figure 3D:
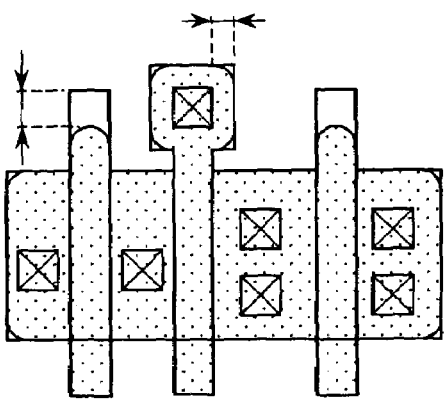

In Step S4, the evaluation value calculating unit 17 compares the device pattern obtained in Step S3, with the design layout pattern. Then, the evaluation value (i.e., size deviation and ED-window) is calculated, as shown in FIG. 3D.

In Step S5, the determining unit 18 determines whether the evaluation value satisfies a predetermined condition. For example, it determines whether the evaluation value is smaller than a preset value.

If the evaluation value may be found not to satisfy the predetermined condition, for example, if the evaluation value is not smaller than the preset value, the operation goes to Step S6. In Step S6, process parameters included in the parameter group 13 are adjusted (changed) to make the evaluation value satisfy the predetermined condition. The process parameters thus adjusted are fed back to Steps S2 and S3.

If the evaluation value satisfies the predetermined condition, for example, if the evaluation value is smaller than the preset value, the operation goes to Step S7. In Step S7, the process-parameter setting unit 19 determines that the process parameters now set in the group 13 are final process parameters. A range for each process parameter may be preset so that an optimal value for the parameter may be set, falling within the range preset.

Any process parameter thus set can be applied to the manufacture of the semiconductor integrated circuit.

In the first embodiment, not only the mask process and the lithography process, but also the etching process is simulated in the simulation step, by using the process parameters included in the parameter group 13. The finished shape of the device pattern to be formed on the semiconductor substrate is thereby predicted. If the device pattern predicted does not satisfies the predetermined condition, the process parameters included in the group 13 are corrected and fed back to the pattern-correcting step and the simulation step. The process parameters adjusted in accordance with a size change occurring in the etching process, are set as final process parameters. Hence, a semiconductor device having desired patterns can be manufactured, no matter how small the device is.

In the first embodiment of the invention, various steps are performed in sequence, controlled by control means such as a computer that is controlled by a program that describes the sequence of steps. The program may be recorded in a recording medium such as a magnetic disk and read into the computer. The computer carries out the aforementioned sequence of steps in accordance with the program read into it.

Figure 4:
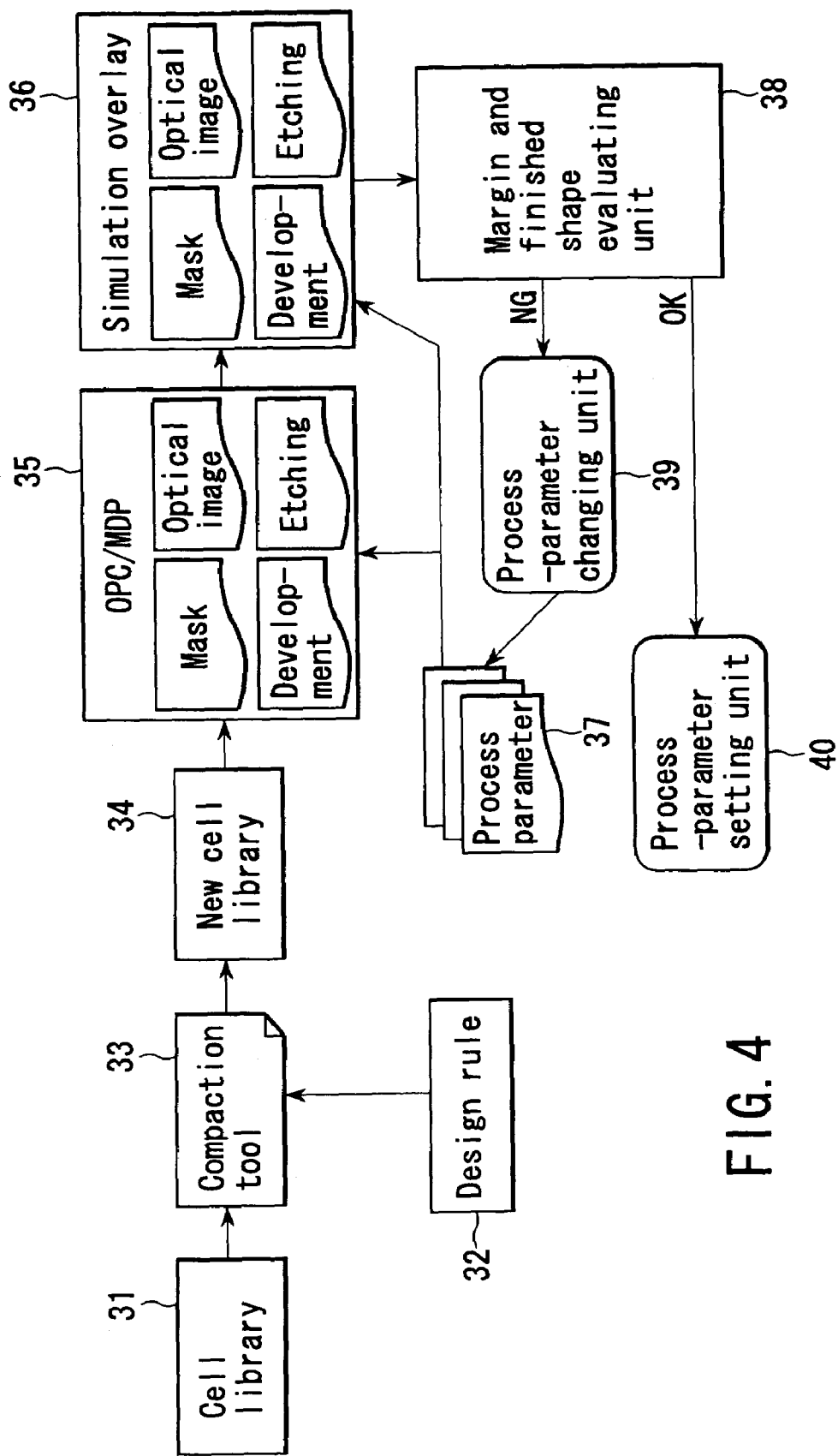
FIG. 4 is a diagram depicting a method related to the first embodiment, designed to manufacture standard cells.

The process-parameter setting system and the method for generating process parameters, both described above, may be modified as shown in FIG. 4 in order to manufacture standard cells for use in logic LSIs.

The cell library 31 contains hundreds of standard cell patterns for use in various generations. New standard cell patterns can be designed on the basis of the given design rules. The design rule section 32 define the dimensional relation between layers, etc.. The dimensional relation is based on, for example, overlay errors and the size changes of the device patterns to be formed on wafers.

All cell patterns contained in the cell library 31 and the design rules 32 for the next-generation are input to the compaction tool 33. The compaction tool 33 generates a new cell library 34. The mask-data processing unit 35 performs mask-data processing on the standard cell patterns contained in the new cell library 34. The simulator 36 performs simulation, predicting a device pattern to be formed on a semiconductor substrate. Note that the process parameters included in the parameter group 37 are applied in the mask-data processing and the simulation. Thereafter, the evaluation value calculating unit 38 evaluates the device pattern obtained by the simulation. The process-parameter changing (adjusting) unit 39 adjusts the process parameters so that the process latitude becomes maximum. When process parameters are optimized, the process-parameter setting unit 40 sets these parameters as final process parameters.

Using the final process parameters thus set, finished shape of the device pattern on a semiconductor substrate is estimated. Desired dose latitude and focus latitude are obtained.

Thus, the first embodiment of the invention finally sets process parameters that have been adjusted in accordance with the size changes that take place in the etching process. The process parameters set serve to form appropriate device patterns.

Second Embodiment

The basic concept of the second embodiment of the present invention will be explained first.

Figure 7A:
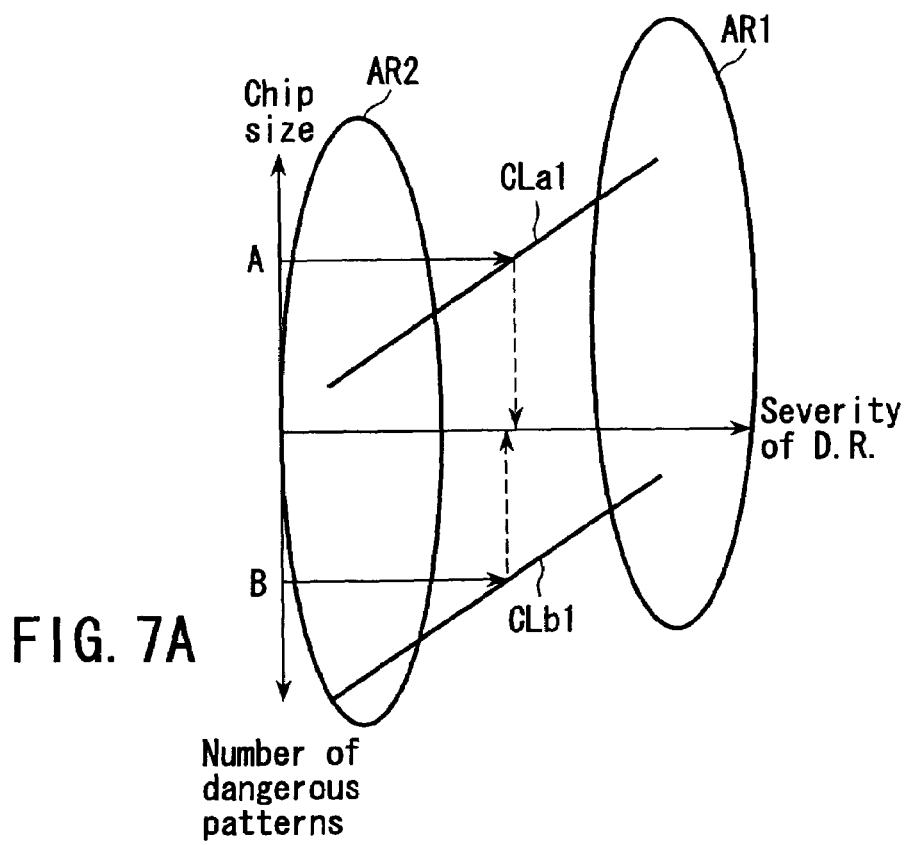
FIGS. 7A and 7B are diagrams explaining the principle of a second embodiment of the invention.

FIG. 7A is a schematic representation of the relation between the severity of design rules (D.R.), on the one hand, and the chip size and the number of dangerous patterns, on the other hand. The severity of D.R. is plotted on the abscissa, decreasing toward the right and increasing toward the left. The chip size and the number of dangerous patters are plotted on the upper half and lower half of the ordinate, respectively. As seen from Area AR1, if the D.R. severity is low, the number of dangerous patterns can be small, though the chip size is large. As seen from Area AR2, if the D.R. severity is high, the chip size can be small, though the number of dangerous patterns is large.

The chip size and the number of dangerous patterns are preset in accordance with the specifications of the device. Assume that the chip size is preset to A or less and the number of dangerous patterns to B or less, as illustrated in FIG. 7A. In this case, a guideline for setting the design rule (D.R.) can be obtained on the basis of critical lines CLa1 and CLb1 shown in FIG. 7A. The relation as described above can be calculated by using actual patterns, a mask-data processing tool and a lithography-simulation tool. Based on the relations thus calculated, appropriate design rules can be set for each of the devices.

Figure 7B:
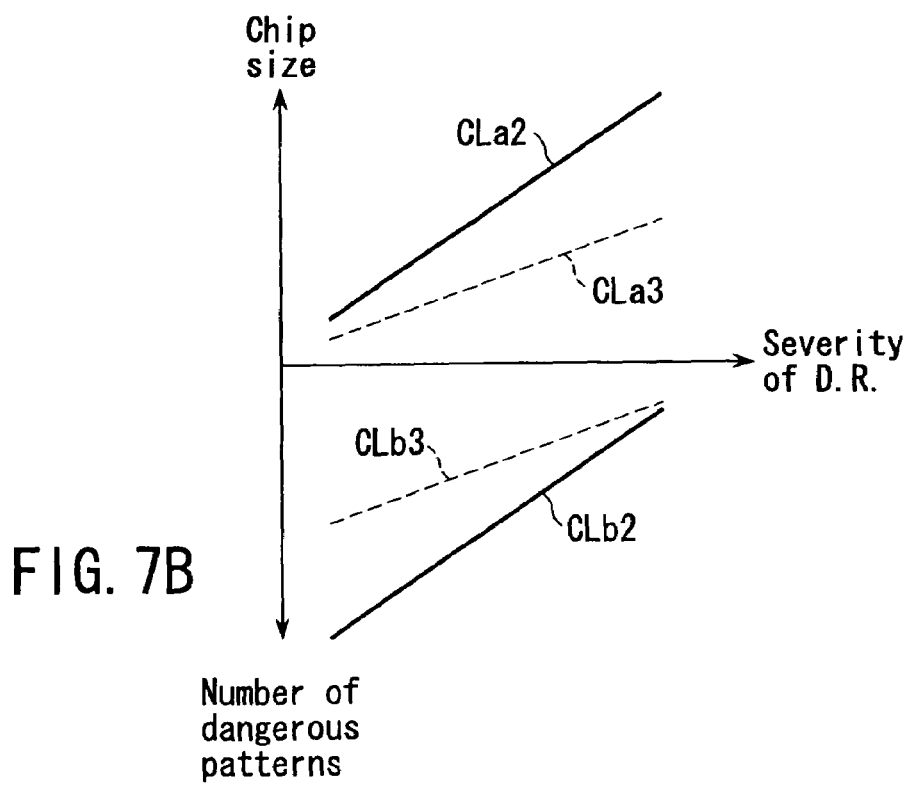

In the case shown in FIG. 7A, type of the design rule is fixed, and value of the design rule may be changed. If the design rule types increase, such a relation as illustrated in FIG. 7B is obtained. That is, inclinations indicated by critical lines CLa2 and CLb2, respectively, will change to inclinations indicated by critical lines Cla3 and CLb3, when design rule types increase. In other words, if more types of design rules are applied, both the chip size and the number of dangerous patterns can be small even when the D.R. severity is high.

The second embodiment will be described in detail.

First, the system and method for setting only design rules, both according to the second embodiment, will be described.

Figure 8:
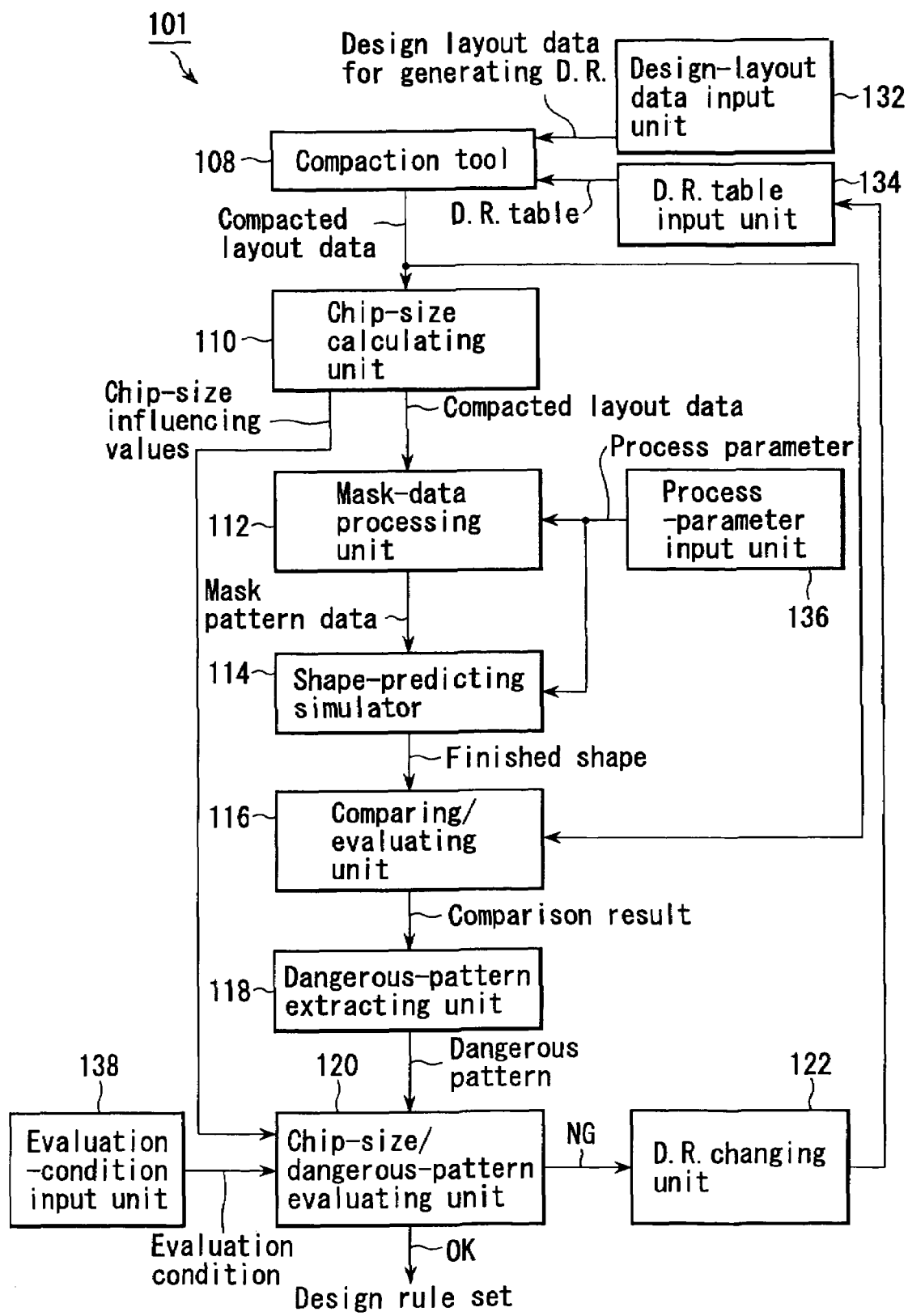
FIG. 8 is a block diagram of a system according to the second embodiment of the invention.

FIG. 8 is a block diagram of the design-rule setting system 101 according to the second embodiment. The system 101 comprises a compaction tool 108, a chip-size calculating unit 110, a mask-data processing unit 112, a shape-predicting simulator 114, a comparing/evaluating unit 116, a dangerous-pattern extracting unit 118, a chip-size/dangerous-pattern evaluating unit 120, a D.R. changing unit 122, a design-layout data input unit 132, a D.R. table input unit 134, a process-parameter input unit 136, and an evaluation-condition input unit 138.

The design-layout data input unit 132 inputs data representing the existing design layout patterns for generating D.R. of a semiconductor integrated circuit, to the compaction tool 108. The D.R. table input unit 134 inputs a D.R. table for the next generation device, to the compaction tool 108.

In accordance with the D.R. table the compaction tool 108 compacts the design layout data for generating design rules, generating compacted layout pattern data. The compacted layout data will be used as layout data for the next-generation devices. The compacted layout data is supplied to the chip-size calculating unit 110 and the comparing/evaluating unit 116.

From the compacted layout data the chip-size calculating unit 110 calculates values such as the compacted-layout area and shrink ratio that influence the chip size. The values that influence the chip size are supplied to the chip-size/dangerous-pattern evaluating unit 120.

The process-parameter input unit 136 inputs process parameters to the mask-data processing unit 112 and shape-predicting simulator 114. Among the process parameters are: the wavelength of exposure light, the numerical aperture (NA) of the lens of the exposure apparatus, the illumination shape ($\sigma$, $\epsilon$) of the exposure apparatus, the phase and transmittance of the mask, and the parameters of developing and resist processes.

Using the process parameters given, the mask-data processing unit 112 performs mask-data processing on the compacted layout pattern data, generating mask pattern data. The mask pattern data is supplied to the shape-predicting simulator 114. It should be noted that the mask-data processing includes OPC processing in the case of light, proximity correction processing in the case of electron beam, and other MDP.

The shape-predicting simulator 114 uses the mask pattern data and the process parameters, thus performing lithography simulation and calculating a finished shape of the pattern to be formed on the wafer. The data representing the finished shape is supplied to the comparing/evaluating unit 116. Note that the shape of mask pattern, the shape of resist pattern on the wafer, or the shape of wafer-processed pattern, which are experimentally obtained, may be used as the finished shape. If this is the case, it is unnecessary to employ the shape-predicting simulator 114. This holds true of the modification of the system 101, too, which will be described later.

The comparing/evaluating unit 116 compares the finished shape with the compacted layout data, finding a difference (error value) between the finished shape and the compacted layout, for each edge of any pattern of the design layout. Further, the unit 116 monitors the data that represents the difference and the position where the difference occurs.

The dangerous-pattern extracting unit 118 extracts the type and number of dangerous patterns (dangerous spots or hot spots) from the data monitored, in accordance with the compared result obtained by the comparing/evaluating unit 116. The dangerous pattern is such a pattern that cannot secure a predetermined margin on the wafer. The data about the dangerous patterns extracted is supplied to the chip-size/dangerous-pattern evaluating unit 120. To extract dangerous patterns, the exposure dose, the exposure focus, the average size of the finished shape of the mask, the size variation of the mask, the aberration of the lens, the overlay error, and the like are changed to satisfy the process conditions desired in practice.

The evaluation-condition input unit 138 inputs evaluation conditions, which have been preset for the type or number of the dangerous patterns and for values that influence the chip size, to the chip-size/dangerous-pattern evaluating unit 120.

The chip-size/dangerous-pattern evaluating unit 120 compares the chip size and the number of dangerous patterns with the evaluation conditions. If both the chip size and the number of dangerous patterns satisfy the respective evaluation conditions, the unit 120 sets the design rules as being optimal to manufacture the semiconductor integrated circuit. If either the chip size or the number of dangerous patterns, or both, do not satisfy the evaluation conditions, the unit 120 outputs the compared results to the D.R. changing unit 122. The D.R. changing unit 122 changes the design rules based on the compared results. The changed design rules are supplied to the D.R. table input unit 134, as new design rules.

The design-rule setting system 101 shown in FIG. 8 performs the sequence of setting design rules, which is described in recipe file stored in the memory (not shown). How the system 101 operates will be explained, with reference to the flowchart of FIG. 9.

In Step S1, the compaction tool 108 compacts the layout data for generating design rules, in accordance with the D.R. table. The chip-size calculating unit 110 calculates values that influence the chip size.

In Step S12, the mask-data processing unit 112 performs mask-data processing on the compacted layout data by using given process condition (process parameters), and generates mask pattern data.

In Step S13, the shape-predicting simulator 114 uses the mask pattern data and the process parameters, thus performing lithography simulation and calculating a finished shape of the pattern to be formed on the wafer. Note that the shape of mask pattern, the shape of resist pattern on the wafer, or the shape of wafer-processed pattern, which are experimentally obtained, may be used as the finished shape.

A mask shape experimentally obtained, the shape of resist pattern on the wafer, or the shape of pattern on the wafer processed may replace the finished shape.

In Step S14, the comparing/evaluating unit 116 compares the finished shape with the compacted layout data. To be more specific, the unit 116 finds a difference (error value) between the finished shape and the compacted layout data, for each edge of any pattern of the design layout. Moreover, the unit 116 monitors the data that represents the difference and the position where the difference occurs. The dangerous-pattern extracting unit 118 extracts the type and number of dangerous patterns, which cannot secure a predetermined margin on the wafer, from the data monitored.

In Step S15, the chip-size/dangerous-pattern evaluating unit 120 compares the chip size and the number of dangerous patterns with the preset evaluation conditions. In Step S16, the unit 120 determines whether both the chip size and the number of dangerous pattern satisfy the evaluation conditions based on the compared result.

If YES in Step S16, the operation goes to Step S17. In Step S17, the unit 120 sets the design rules as being optimal for the semiconductor integrated circuit. If NO in Step S16, the operation goes to Step S18. In Step S18, the D.R. changing unit 122 changes the design rules. Then, the steps described above are repeated until the evaluation conditions are satisfied. Thus, optimal design rules are finally obtained.

In the second embodiment, the chip size information and the dangerous pattern information (dangerous spot information) are compared with the prescribed evaluation conditions and the design rules are changed in accordance with the compared result. Thus, the second embodiment can obtain appropriate design rules that help to reduce the chip size and the number of dangerous patterns.

The system for setting design rules and process parameters and the method thereof, both according to the second embodiment, will be described.

Figure 10:
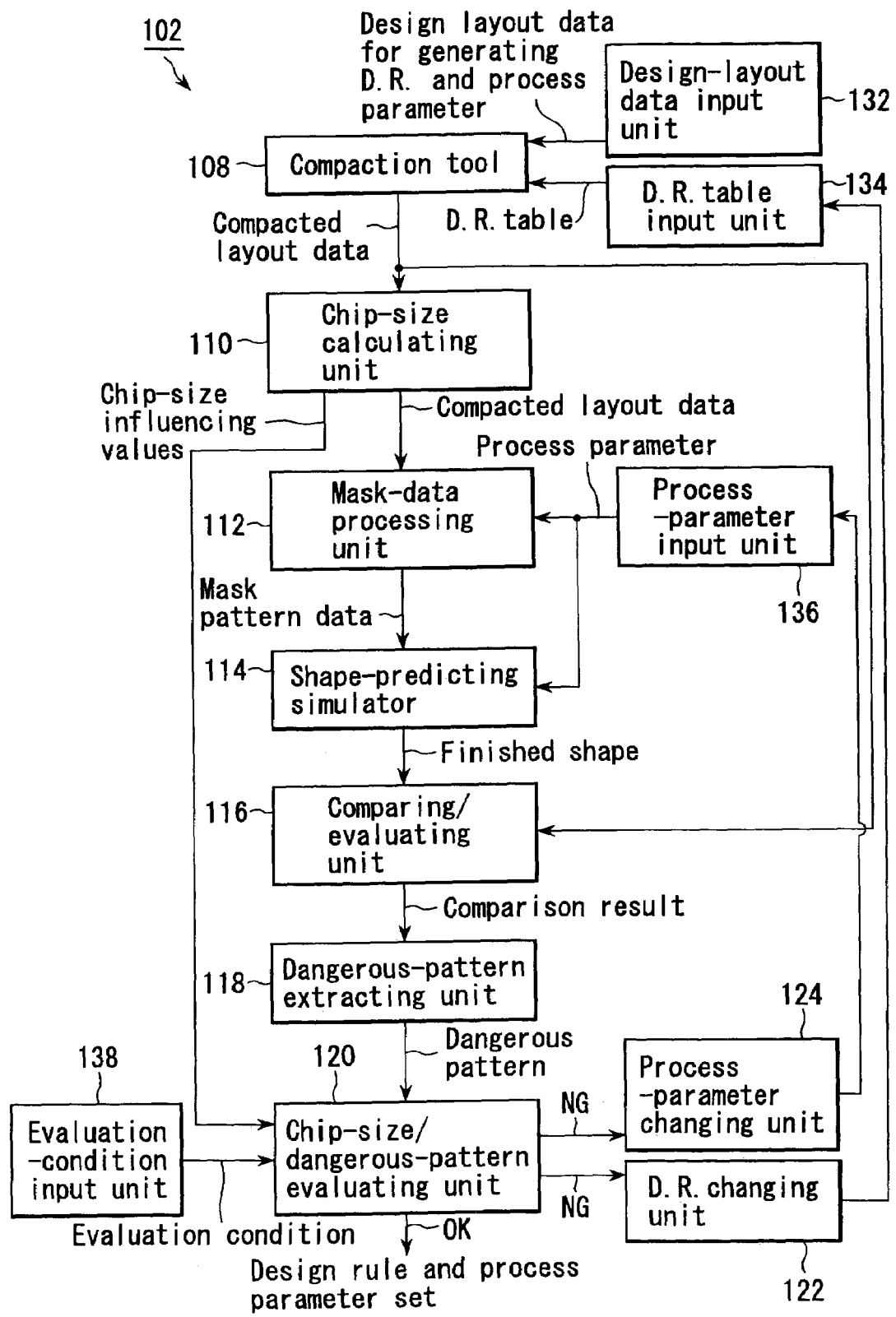
FIG. 10 is a block diagram showing another system according to the second embodiment of this invention.

FIG. 10 is a block diagram showing a design rule/process-parameter setting system 102. As seen from FIG. 10 compared with FIG. 8, the system 102 differs from the system 101 in that has an additional component, i.e., process-parameter changing unit 124. The system 102 can therefore change design rules and/or process parameters, to set optimal design rules and process parameters.

The design-layout data input unit 132 inputs the design layout data to the compaction tool 108. The design layout data is used to generate design rules and process parameters. The chip-size/dangerous-pattern evaluating unit 120 compares the chip size and the number of dangerous patterns with preset evaluation conditions. If both the chip size and the number of dangerous pattern satisfy the evaluation conditions, the unit 120 sets the design rules and the process parameters as being optimal for the semiconductor integrated circuit. If either the chip size or the number of dangerous patterns, or both, do not satisfy the evaluation conditions, the unit 120 determines whether either the design rules and the process parameters, or both, should be changed or not. The result of decision is output to the D.R. changing unit 122 or the process-parameter changing unit 124, or both.

If the result of decision indicates that the design rules should be changed, the D.R. changing unit 122 changes the design rules, generating new design rules. The new design rules are supplied to the D.R. table input unit 134. If the result of decision indicates that the process parameters should be change, the process-parameter changing unit 124 changes the process parameters, generating new process parameters. The new process parameters are supplied to the process-parameter input unit 136.

The other components of the system 102 (FIG. 10) are almost identical to their equivalents of the system 101 shown in FIG. 8. Hence, they will not be described in detail.

The design-rule setting system 102 of FIG. 10 performs the sequence of setting design rules and parameters, which is described in recipe file stored in the memory (not shown). How the system 102 operates will be explained, with reference to the flowchart of FIG. 11.

Figure 9:
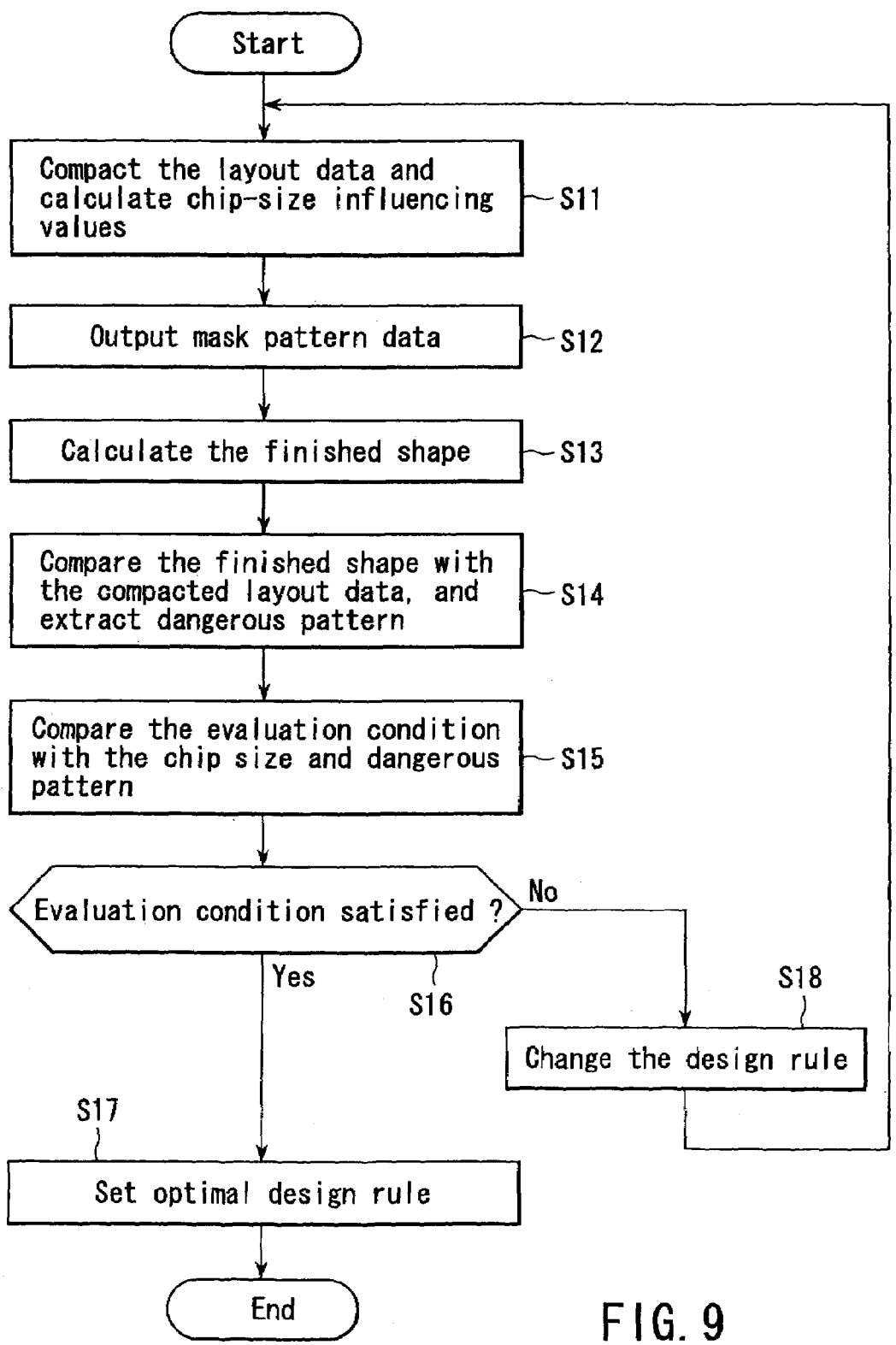
FIG. 9 is a flowchart explaining a method related to the second embodiment of the invention.
Figure 11:
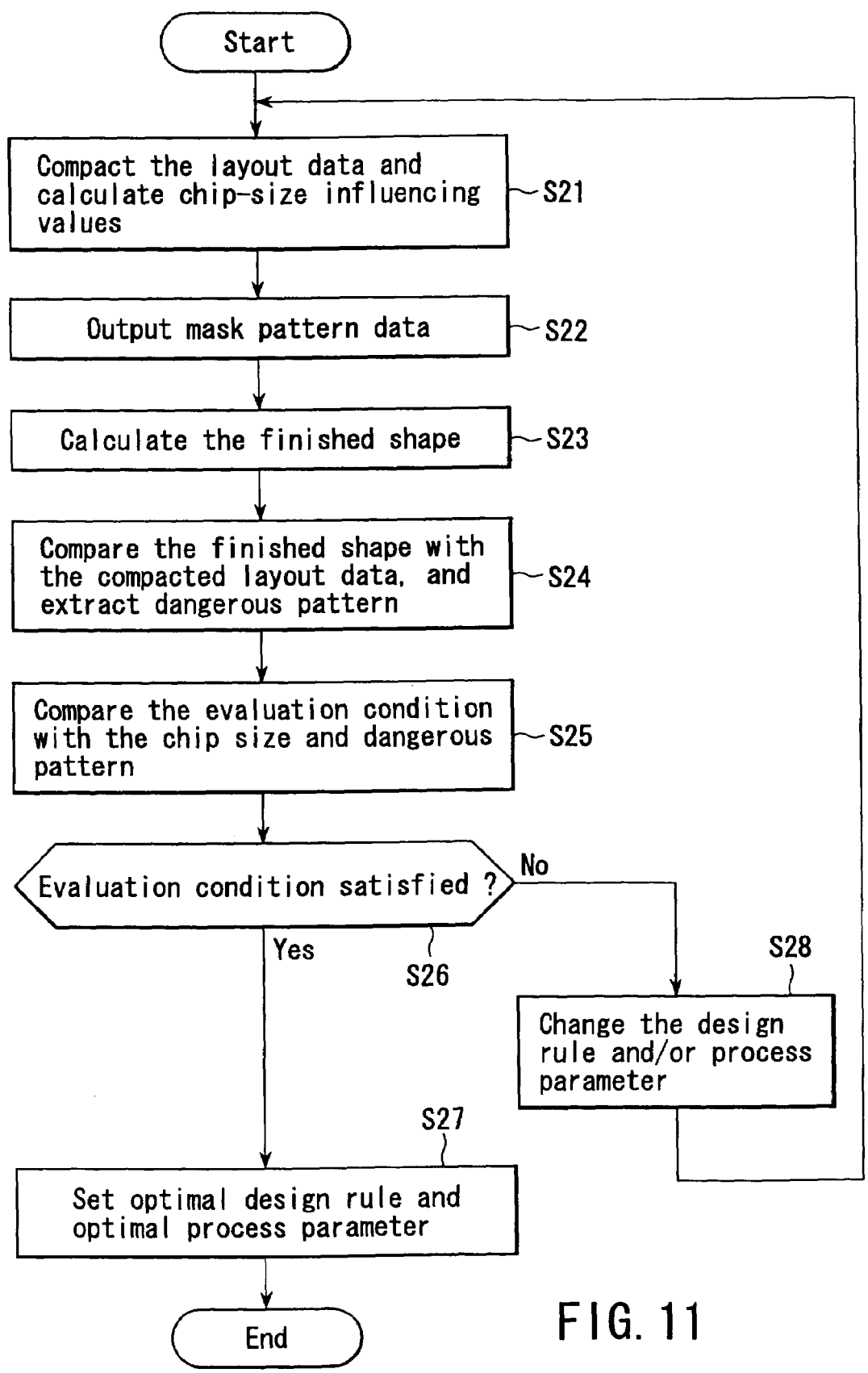
FIG. 11 is a flowchart explaining another method related to the second embodiment of the invention.

As seen from FIG. 11, all steps are almost identical to those shown in the flowchart of FIG. 9, except Steps S21, S23, S27 and S28. Steps S21, S23, S27 and S28 will therefore be explained in detail.

In Step S21, the compaction tool 108 compacts the layout data for generating design rules and process parameters, in accordance with the D.R. table. The chip-size calculating unit 110 calculates values that influence the chip size.

In Step S22, the mask-data processing unit 112 performs mask-data processing on the compacted layout data by using given process condition (process parameters), and generates mask pattern data. In Step S23, the shape-predicting simulator 114 uses the mask pattern data and the process parameters, performing lithography simulation and calculating a finished shape of the pattern to be formed on the wafer.

In Step S24, the comparing/evaluating unit 116 compares the finished shape with the compacted layout, and the dangerous-pattern extracting unit 118 extracts the type and number of the dangerous patterns. In Step S25, the chip-size/dangerous-pattern evaluating unit 120 compares the chip size and the number of dangerous patterns with preset evaluation conditions. In Step S26, the unit 120 determines, from the result of comparison, whether both the chip size and the number of dangerous pattern satisfy the evaluation conditions.

If YES in Step S26, the operation goes to Step S27. In Step S27, the unit 120 sets the design rules and the process parameters as being optimal for the semiconductor integrated circuit. If NO in Step S26, the operation goes to Step S28. In Step S28, the design rules and/or the process-parameters are changed by the D.R. changing unit 122 and/or the process-parameter changing unit 124. Then, the steps described above are repeated until the evaluation conditions are satisfied. Thus, optimal design rules and process parameters are finally obtained.

In the modification of the second embodiment, the chip size information and the dangerous pattern information (dangerous spot information) are compared with the prescribed evaluation conditions. The design rules or the process parameters, or both, are changed in accordance with the compared result. Thus, the modification of the second embodiment can obtain appropriate design rules and process parameters that help to reduce the chip size and the number of dangerous patterns.

The method of the second embodiment described above, may be employed to manufacture semiconductor integrated circuits. Then, semiconductor integrated circuits of small chip size can be manufactured, requiring but a short TAT (Turn Around Time).

In the first and second embodiments, various steps are performed in sequence, controlled by control means such as a computer that is controlled by a program that describes the sequence of steps. The program may be recorded in a recording medium, such as a floppy disk or a CD-ROM, and may be read into the computer. The computer carries out the sequence of steps in accordance with the program read into it. Nonetheless, the recording medium is not limited to movable one such as a magnetic disk and an optical disk. It may be a fixed medium such as a hard disk or a memory. Furthermore, the program may be provided via wired or wireless communications networks, such as the Internet. The program may be encrypted, modulated or compressed.

The method described in the first and second embodiments can be used for various kind of lithography such as X-ray lithography, EUV (Extream Ultra-Violet) lithography or EB (Electron-Beam) lithography.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of setting at least one of a process parameter and a design rule for use in manufacturing a semiconductor integrated circuit, comprising:

compacting a first pattern by using design rule information to obtain a second pattern, the first pattern being one which corresponds to a design layout of the semiconductor integrated circuit;

obtaining chip size information of the semiconductor integrated circuit, which relates to the second pattern;

obtaining a third pattern by using process parameter information, the third pattern being one which corresponds to the second pattern and which is to be formed on a semiconductor wafer;

comparing the third pattern with the second pattern to obtain a comparison result;

extracting a dangerous spot from the second pattern by using the comparison result to obtain dangerous spot information, the dangerous spot not having prescribed latitude;

determining whether the chip size information and the dangerous spot information satisfy evaluation conditions, respectively; and changing at least one of the design rule information and the process parameter information when at least one of the chip size information and the dangerous spot information is determined not to satisfy the evaluation conditions.

2. The method according to claim 1, further comprising:
setting the changed design rule information as the design rule information in compacting the first pattern; and
setting the changed process parameter information as the process parameter information in obtaining the third pattern.

3. The method according to claim 2, wherein said changing at least one of the design rule information and the process parameter information to said determining whether the chip size information and the dangerous spot information satisfy evaluation conditions are repeated until the chip size information and the dangerous spot information satisfy the evaluation conditions, respectively.

4. The method according to claim 1, wherein the third pattern is predicted by simulation.

5. The method according to claim 1, wherein the third pattern is predicted by using photolithography mask data or electron-beam lithography data obtained by performing proximity correction on the second pattern.

6. The method according to claim 1, wherein the third pattern corresponds to a shape of a resist pattern on the semiconductor wafer or a shape of a pattern of the semiconductor wafer processed, said shapes having been experimentally obtained.

7. The method according to claim 1, wherein the dangerous spot information is obtained by changing at least one of an exposure dose, an exposure focus, an average size of a mask pattern, a size variation of a mask pattern, a lens aberration, and an overlay error.

8. The method according to claim 1, wherein the process parameter information includes at least one of wavelength of exposure light, numerical aperture (NA) of a lens of an exposure apparatus, an illumination shape ($\sigma$, $\epsilon$) of an exposure apparatus, phase of a photomask, transmittance of a photomask, developing process parameter, and resist process parameter.

9. A method of manufacturing a semiconductor device, comprising forming a pattern on a semiconductor substrate by using the method according to claim 1.

10. A system for setting at least one of a process parameter and a design rule for use in manufacturing a semiconductor integrated circuit, comprising:
means for compacting a first pattern by using design rule information to obtain a second pattern, the first pattern being one which corresponds to a design layout of the semiconductor integrated circuit;
means for obtaining chip size information of the semiconductor integrated circuit, which relates to the second pattern;
means for obtaining a third pattern by using process parameter information, the third pattern being one which corresponds to the second pattern and which is to be formed on a semiconductor wafer;
means for comparing the third pattern with the second pattern to obtain a comparison result;
means for extracting a dangerous spot from the second pattern by using the comparison result to obtain dangerous spot information, the dangerous spot not having prescribed latitude;
means for determining whether the chip size information and the dangerous spot information satisfy evaluation conditions, respectively; and
means for changing at least one of the design rule information and the process parameter information when at least one of the chip size information and the dangerous spot information is determined not to satisfy the evaluation conditions.

11. A program for setting at least one of a process parameter and a design rule for use in manufacturing a semiconductor integrated circuit, said program causing a computer to:
compact a first pattern by using design rule information to obtain a second pattern, the first pattern being one which corresponds to a design layout of the semiconductor integrated circuit;
obtain chip size information of the semiconductor integrated circuit, which relates to the second pattern;
obtain a third pattern by using process parameter information, the third pattern being one which corresponds to the second pattern and which is to be formed on a semiconductor wafer;
compare the third pattern with the second pattern to obtain a comparison result;
extract a dangerous spot from the second pattern by using the comparison result to obtain dangerous spot information, the dangerous spot not having prescribed latitude;
determine whether the chip size information and the dangerous spot information satisfy evaluation conditions, respectively; and
change at least one of the design rule information and the process parameter information when at least one of the chip size information and the dangerous spot information is determined not to satisfy the evaluation conditions.

* * * * *